United States Patent
Itakura

(10) Patent No.: US 12,456,710 B2
(45) Date of Patent: Oct. 28, 2025

(54) SEMICONDUCTOR DEVICE

(71) Applicant: Kioxia Corporation, Tokyo (JP)

(72) Inventor: Satoru Itakura, Machida Tokyo (JP)

(73) Assignee: Kioxia Corporation, Tokyo (JP)

( * ) Notice: Subject to any disclaimer, the term of this patent is extended or adjusted under 35 U.S.C. 154(b) by 488 days.

(21) Appl. No.: 17/891,881

(22) Filed: Aug. 19, 2022

(65) Prior Publication Data

US 2023/0282616 A1    Sep. 7, 2023

(30) Foreign Application Priority Data

Mar. 7, 2022 (JP) ................................. 2022-034338

(51) Int. Cl.
*H01L 25/065* (2023.01)
*H01L 25/18* (2023.01)

(52) U.S. Cl.
CPC .......... *H01L 25/0652* (2013.01); *H01L 25/18* (2013.01); *H01L 2225/06506* (2013.01); *H01L 2225/0651* (2013.01); *H01L 2225/06517* (2013.01); *H01L 2225/06537* (2013.01); *H01L 2225/06562* (2013.01); *H01L 2225/06586* (2013.01); *H01L 2225/06589* (2013.01)

(58) Field of Classification Search
CPC .......................... H01L 25/0652; H01L 25/071
See application file for complete search history.

(56) References Cited

U.S. PATENT DOCUMENTS

| | | | |
|---|---|---|---|
| 10,727,206 B2 | 7/2020 | Ye et al. | |
| 2011/0175222 A1 | 7/2011 | Kim et al. | |
| 2019/0067250 A1 | 2/2019 | Tojo et al. | |
| 2019/0198452 A1* | 6/2019 | Ono | H01L 23/3135 |
| 2019/0287945 A1 | 9/2019 | Tojo et al. | |
| 2020/0020669 A1 | 1/2020 | Uchida et al. | |
| 2020/0075543 A1 | 3/2020 | Kosaka | |
| 2021/0066279 A1 | 3/2021 | Yu et al. | |
| 2022/0013477 A1 | 1/2022 | Homma et al. | |
| 2022/0045008 A1* | 2/2022 | Kang | H01L 23/5385 |
| 2022/0059493 A1 | 2/2022 | Okada et al. | |

FOREIGN PATENT DOCUMENTS

| | | |
|---|---|---|
| TW | 201913933 A | 4/2019 |
| TW | 202006907 A | 2/2020 |
| TW | 202109794 A | 3/2021 |
| TW | 202209585 A | 3/2022 |

* cited by examiner

*Primary Examiner* — Yu-Hsi D Sun
(74) *Attorney, Agent, or Firm* — Holtz, Holtz & Volek PC

(57) ABSTRACT

A semiconductor device includes: a wiring board having a surface; a chip stack disposed above the surface and including a first semiconductor chip; a second semiconductor chip disposed between the surface and the chip stack; a spacer disposed between the surface and the first semiconductor chip, the spacer surrounding the second semiconductor chip along the surface, and the spacer containing a material higher in thermal conductivity than silicon; and a sealing insulation layer covering the chip stack.

20 Claims, 9 Drawing Sheets

A3-B3

A4-B4

A7-B7

SEMICONDUCTOR DEVICE

CROSS-REFERENCE TO RELATED APPLICATION

This application is based upon and claims the benefit of priority from Japanese Patent Application No. 2022-034338, filed on Mar. 7, 2022; the entire contents of which are incorporated herein by reference.

FIELD

Embodiments relate to a semiconductor device.

BACKGROUND

A semiconductor device such as a NAND flash memory has a plurality of semiconductor chips stacked on a wiring board.

DETAILED DESCRIPTION

Figure 1:
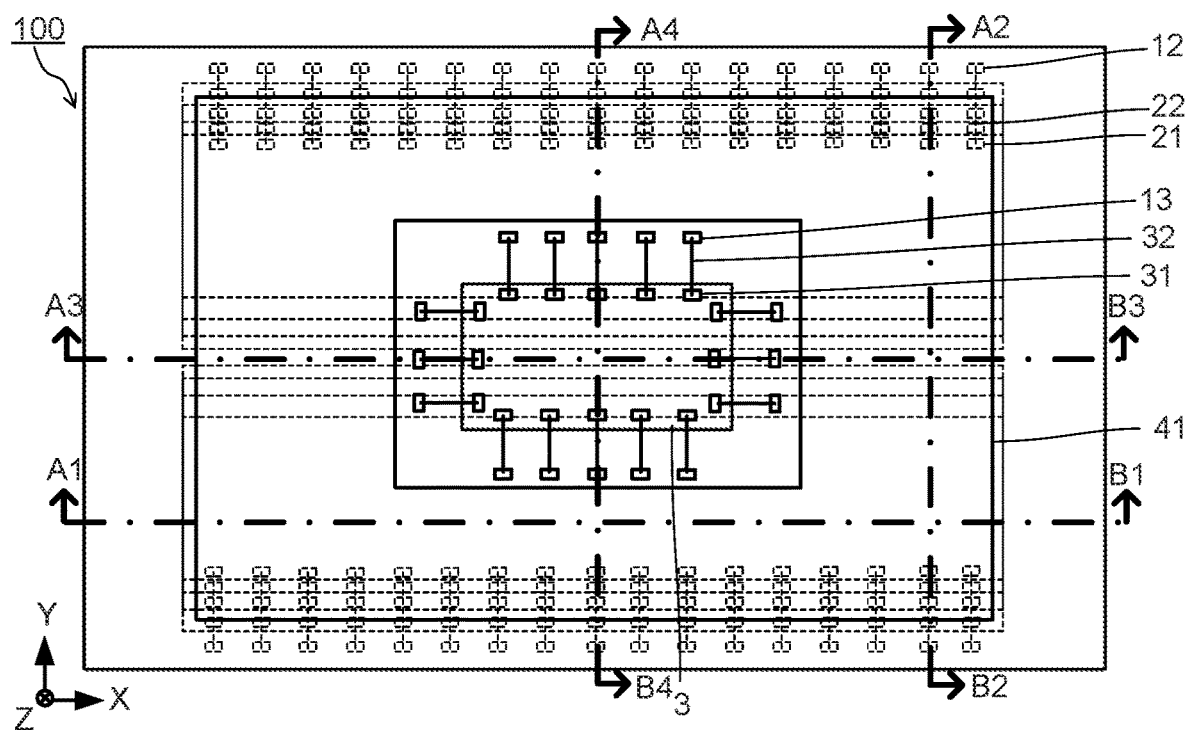
FIG. 1 is a schematic plan view illustrating a first structure example of a semiconductor device.

A semiconductor device of an embodiment includes: a wiring board having a surface; a chip stack disposed above the surface and having a first semiconductor chip; a second semiconductor chip disposed between the surface and the chip stack; a spacer disposed between the surface and the first semiconductor chip, the spacer surrounding the second semiconductor chip along the surface, and the spacer containing a material higher in thermal conductivity than silicon; and a sealing insulation layer covering the chip stack.

Embodiments will be hereinafter described with reference to the drawings. A relation of the thickness and planar dimension of each constituent element, a thickness ratio among the constituent elements, and so on shown in the drawings may be different from actual ones. Further, in the embodiments, substantially the same constituent elements are denoted by the same reference signs and a description thereof will be omitted when appropriate.

In this specification, "connection" includes not only physical connection but also electrical connection unless specifically designated.

First Structure Example of Semiconductor Device

Figure 2:
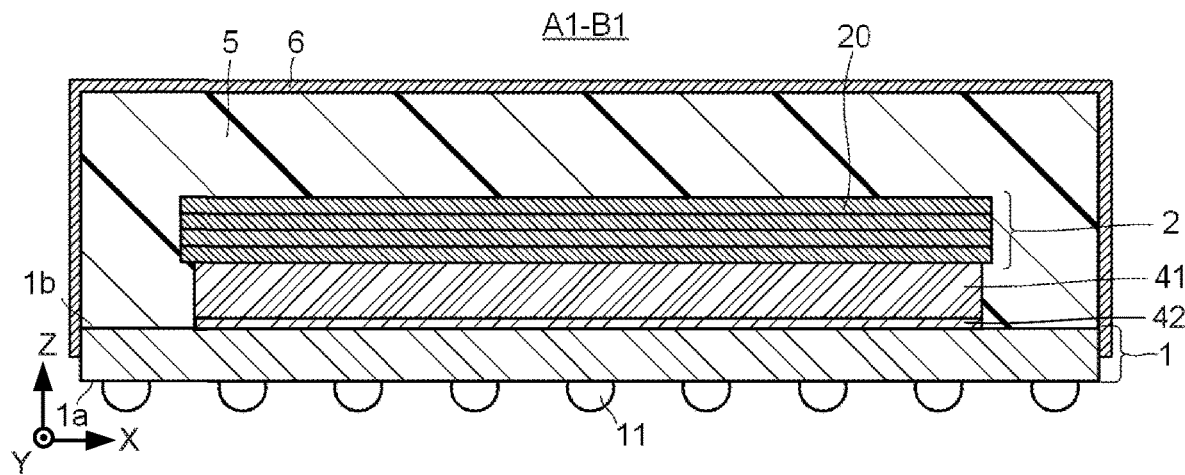
FIG. 2 is an explanatory schematic sectional view of the first structure example of the semiconductor device.
Figure 3:
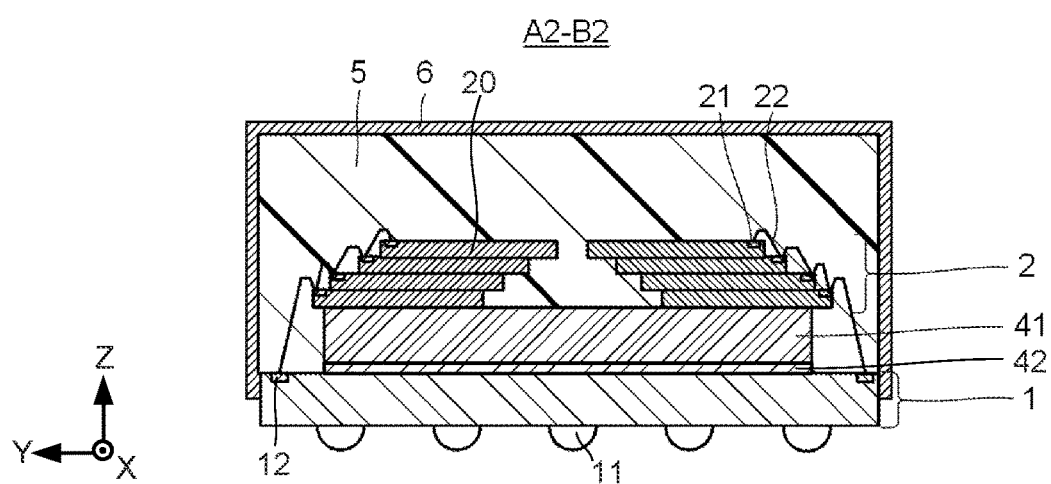
FIG. 3 is an explanatory schematic sectional view of the first structure example of the semiconductor device.
Figure 4:
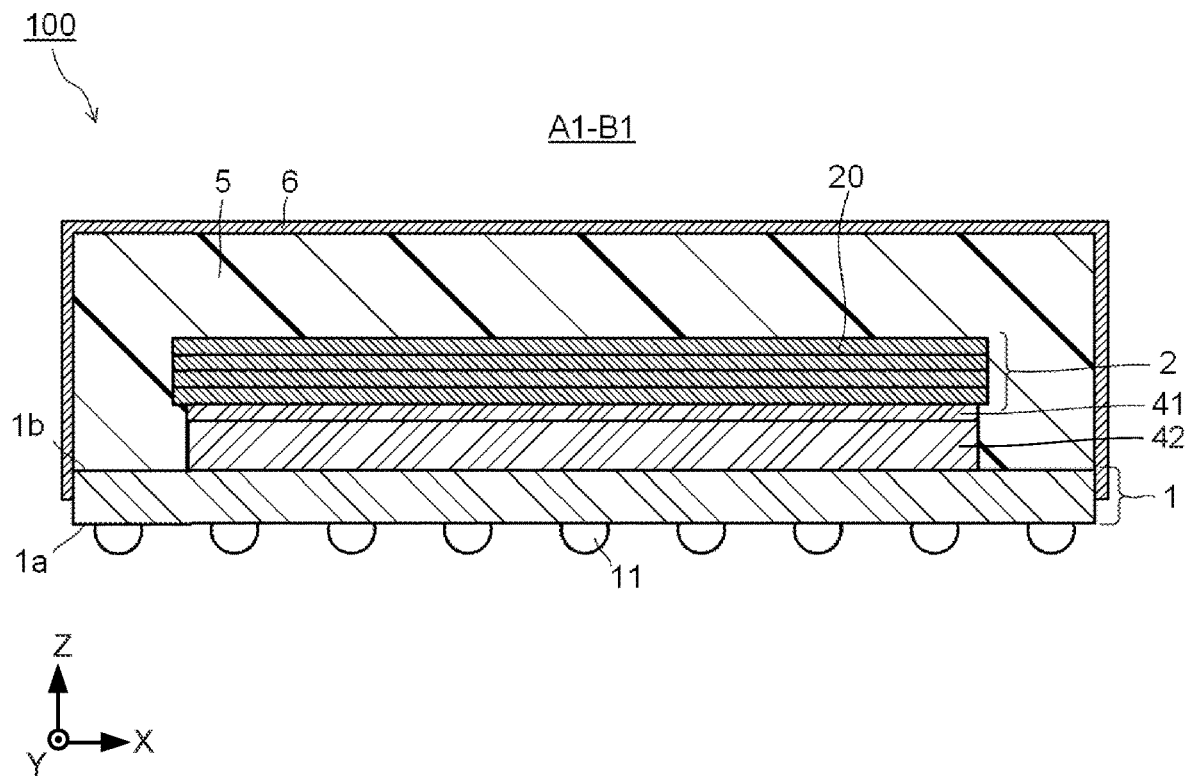
FIG. 4 is an explanatory schematic sectional view of the first structure example of the semiconductor device.
Figure 5:
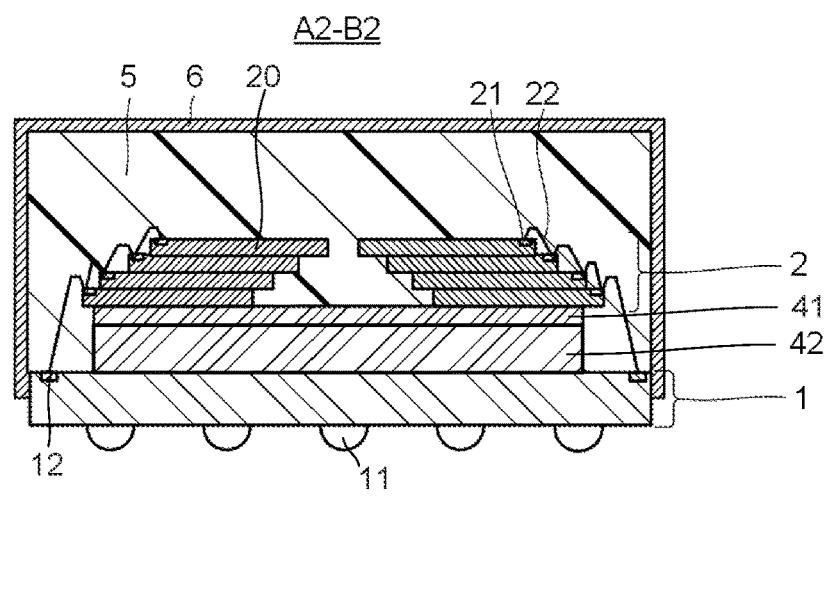
FIG. 5 is an explanatory schematic sectional view of the first structure example of the semiconductor device.
Figure 6:
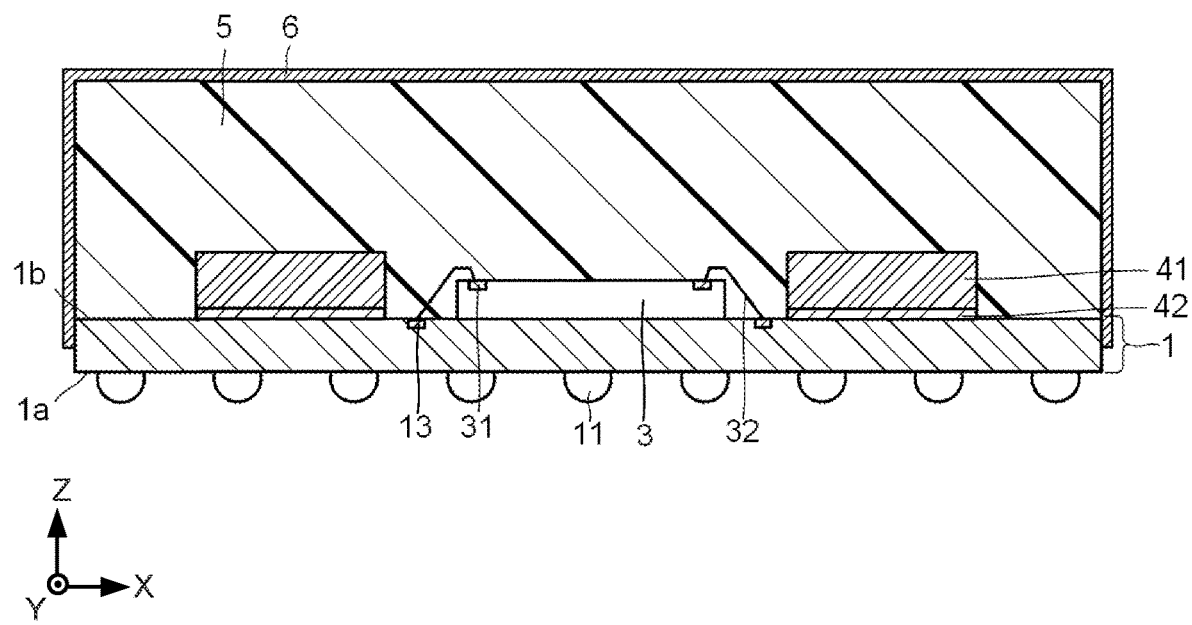
FIG. 6 is an explanatory schematic sectional view of the first structure example of the semiconductor device.
Figure 7:
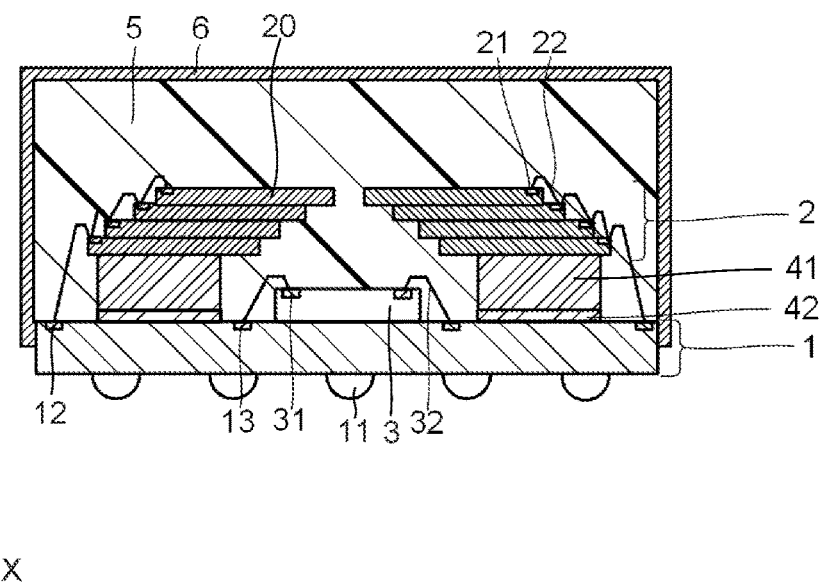
FIG. 7 is an explanatory schematic sectional view of the first structure example of the semiconductor device.

FIG. 1 is a schematic plan view illustrating a first structure example of a semiconductor device. FIG. 2 to FIG. 7 are explanatory schematic sectional views of the first structure example of the semiconductor device. In FIG. 1 to FIG. 7, an X-axis, a Y-axis perpendicular to the X-axis, and a Z-axis perpendicular to the X-axis and the Y-axis are shown. For example, the X-axis is parallel to a surface 1b of a wiring board 1, the Y-axis is parallel to the surface 1b and perpendicular to the X-axis, and the Z-axis is perpendicular to the surface 1b. FIG. 1 illustrates an example of an X-Y plane. In FIG. 1, some constituent elements are not illustrated or illustrated using the dotted lines for convenience. FIG. 2 illustrates an example of an X-Z section along line A1-B1 in FIG. 1. FIG. 3 illustrates an example of a Y-Z section along line A2-B2 in FIG. 1. FIG. 4 illustrates another example of the X-Z section along line A1-B1 in FIG. 1. FIG. 5 illustrates another example of the Y-Z section along line A2-B2 in FIG. 1. FIG. 6 illustrates an example of an X-Z section along line A3-B3 in FIG. 1. FIG. 7 illustrates an example of a Y-Z section along line A4-B4 in FIG. 1.

A semiconductor device 100 includes the wiring board 1, a chip stack 2, a semiconductor chip 3, a spacer 41, a sealing insulation layer 5, and a conductive shield layer 6.

The wiring board 1 includes a plurality of external connection terminals 11 disposed on a surface 1a, and a plurality of bonding pads 12 and a plurality of bonding pads 13 disposed on the surface 1b opposite the surface 1a. Examples of the wiring board 1 include a printed wiring board (PWB).

The external connection terminals 11 are formed using gold, copper, solder, or the like, for instance. The external connection terminals 11 may also be formed using tin-silver-based or tin-silver-copper-based lead-free solder, for instance. The external connection terminals 11 each may also be formed using a stack of a plurality of metallic materials. In FIG. 1, conductive balls are used to form the external connection terminals 11, but bumps may be used to form the external connection terminals 11.

The bonding pads 12 and the bonding pads 13 are each connected to the external connection terminals 11 via internal wiring of the wiring board 1. The bonding pads 12 and the bonding pads 13 each contain a metallic element such as copper, silver, gold, or nickel, for instance. Plating films containing the material may be formed by electrolytic plating or electroless plating to form the bonding pads 12 and the bonding pads 13, for instance. Conductive paste may also be used to form the bonding pads 12 and the bonding pads 13.

The chip stack 2 is above the surface 1b of the wiring board 1. The chip stack 2 includes a plurality of semiconductor chips 20. Examples of the semiconductor chips 20 include memory chips. The semiconductor chips 20 are sequentially stacked above the surface 1b of the wiring board 1 with the spacer 41 between the semiconductor chips 20 and the surface 1b. The chip stack 2 has a first chip stack including four of the semiconductor chips 20 stacked stepwise on the spacer 41 and a second chip stack including four of the semiconductor chips 20 stacked stepwise on the spacer 41. In other words, the semiconductor chips 20 stacked stepwise partly overlap with one another. The number and the stacked structure of the semiconductor chips 20 are not limited to the number and the stacked structure shown in FIG. 1 to FIG. 7.

The semiconductor chips 20 each have a plurality of connection pads 21. The connection pads 21 are each connected to the bonding pad 12 via a corresponding one of bonding wires 22. The bonding wires 22 each contain a metallic element such as gold, silver, copper, or aluminum, for instance. One and another of the semiconductor chips 20 are bonded via an adhesive layer, for instance. The semiconductor chip 20 of the bottom chip of the chip stack 2 is bonded to the spacer 41 via adhesive layers, for instance. Examples of these adhesive layers include die attach films (DAF). FIG. 1 illustrates the bonding pads 12, the semiconductor chips 20, the connection pads 21, and the bonding wires 22 using the dotted lines for convenience.

As illustrated in FIG. 7, the semiconductor chip 3 is provided between the wiring board 1 and the chip stack 2. The semiconductor chip 3 has a plurality of connection pads 31. Each of the connection pad 31 illustrated in FIG. 6 and FIG. 7 is electrically connected to the corresponding bonding pad 13 of the wiring board 1 via the corresponding bonding wire 32 but this is not restrictive, and the wiring board 1 and the semiconductor chip 3 may be joined using flip chip bonding via bumps on the wiring board 1 or the semiconductor chip 3.

Examples of the semiconductor chip 3 include a memory controller chip. The semiconductor chip 3 is mounted on the surface 1b of the wiring board 1 and is electrically connected to the semiconductor chips 20 via the wiring board 1. The semiconductor chip 3 may be provided on the surface 1b via an adhesive layer therebetween. In the case where the semiconductor chips 20 are memory chips and the semiconductor chip 3 is a memory controller chip, the semiconductor chip 3 controls the operation such as writing data to the semiconductor chips 20 and reading data from the semiconductor chips 20, for instance.

The spacer 41 forms a space for mounting the semiconductor chip 3 between the wiring board 1 and the chip stack 2. This enables the semiconductor chip 3 to be mounted under the chip stack 2 to downsize the semiconductor device.

The spacer 41 is between the wiring board 1 and the semiconductor chip 20 of the bottom chip of the chip stack 2. As illustrated in FIG. 1, the spacer 41 continuously surrounds the semiconductor chip 3 along the surface 1b. The spacer 41 is bonded to the wiring board 1 via an adhesive layer 42. Examples of the adhesive layer 42 include a die attach film.

The spacer 41 contains a material higher in thermal conductivity than silicon. The spacer 41 contains metal such as copper, for instance. The spacer 41 may contain ceramic having high thermal conductivity such as aluminum nitride, for instance. Further, as long as the thermal conductivity of the spacer 41 is higher than the thermal conductivity of silicon, the spacer 41 may contain silicon. The spacer 41 may have a substrate made of an insulator such as ceramic and a conductive film of material such as metal formed on the surface of the substrate by plating. The thermal conductivity of the spacer 41 at room temperature is preferably 170 W·m/K or more, for instance. It is more preferably 200 W·m/K or more.

The spacer 41, for example, can be formed by preparing a member made of the high thermal conductivity material processed into a desired shape in advance, and bonding the member to the wiring board 1 via the adhesive layer 42.

The spacer 41 illustrated in FIG. 2 and FIG. 3 is thicker than the adhesive layer 42 but this is not restrictive, and the spacer 41 may be thinner than the adhesive layer 42 as illustrated in FIG. 4 and FIG. 5. Thinning the spacer 41 saves a cost for the spacer 41.

The sealing insulation layer 5 seals the chip stack 2 and the semiconductor chip 3. The sealing insulation layer 5 contains an inorganic filler such as silicon oxide ($SiO_2$) and, for example, can be formed using a sealing resin that is a mixture of the inorganic filler and an resin such as an organic resin by a molding method such as transfer molding, compression molding, or injection molding. FIG. 1 does not illustrate the sealing insulation layer 5 for convenience.

The conductive shield layer 6 covers, for example, at least part of the side surface of the wiring board 1 and the sealing insulation layer 5. For preventing the leakage of an unnecessary electromagnetic wave emitted from wiring layers of the semiconductor chips 20 and the wiring board 1 which are disposed in the sealing insulation layer 5, the conductive shield layer 6 is preferably a metal layer having low electrical resistivity, and is, for example, a metal layer formed of copper, silver, nickel, or the like. The thickness of the conductive shield layer 6 is preferably set based on its electrical resistivity. Parts of vias in the wiring board 1 may be exposed to come in contact with the conductive shield layer 6, thereby connecting the conductive shield layer 6 to wiring lines connected to the external connection terminals such as ground terminals. FIG. 1 does not illustrate the conductive shield layer 6 for convenience.

If a silicon spacer is formed between the wiring board 1 and the chip stack 2, it is difficult to process the silicon spacer into a complicated shape such as a ring shape along the surface 1b though it has thermal conductivity equivalent to the thermal conductivity of a substrate of the semiconductor chip 20. Therefore, for the silicon spacer to surround the semiconductor chip 3 along the surface 1b, it is necessary to form a plurality of silicon spacers using a die bonder. As the number of constituent members of the spacer is larger, it takes a longer time to process them, leading to a cost increase.

In the semiconductor device of this embodiment, on the other hand, the material such as metal or ceramic that is more easily processed than silicon is used to form the spacer between the wiring board 1 and the chip stack 2, enabling only the one spacer to continuously surround the semiconductor chip 3. This can prevent a cost increase. Further, these materials are higher in thermal conductivity than silicon, enabling a reduction in the thermal resistance of the spacer. This can increase the heat dissipation property of the semiconductor device, achieving an improvement in the reliability of the semiconductor device.

Second Structure Example of Semiconductor Device

Figure 8:
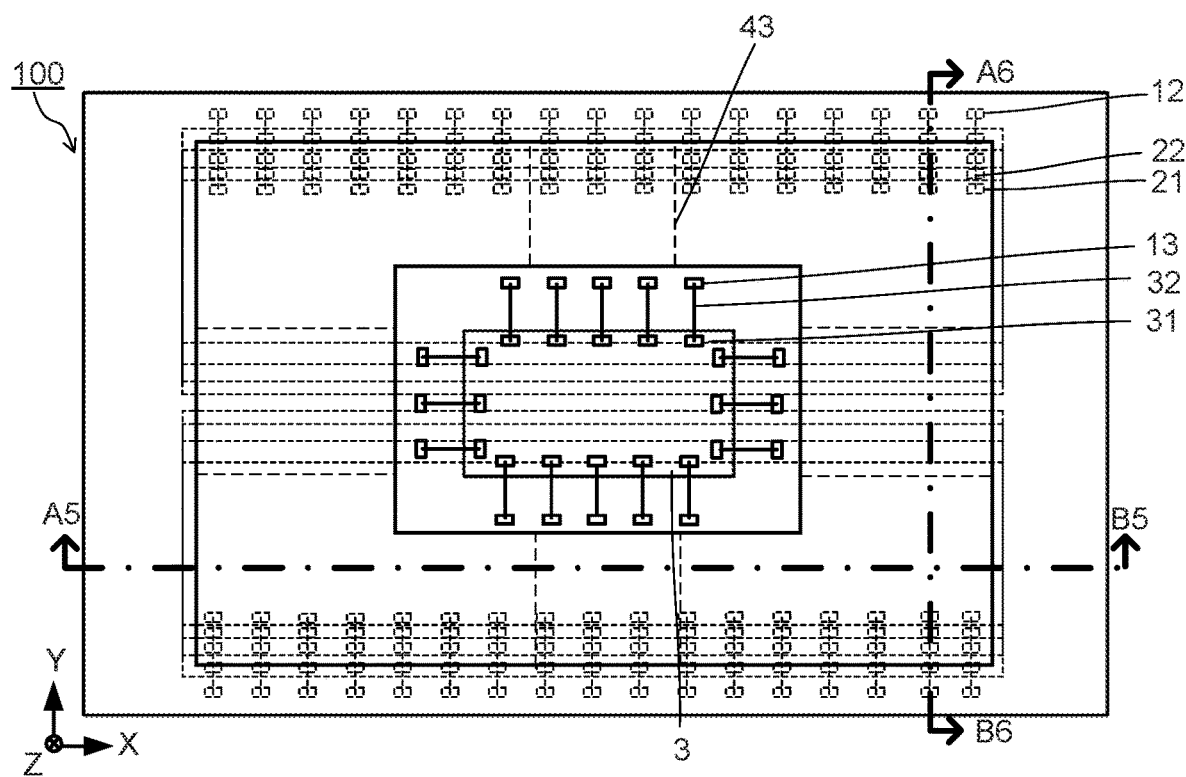
FIG. 8 is a schematic plan view illustrating a second structure example of the semiconductor device.
Figure 9:
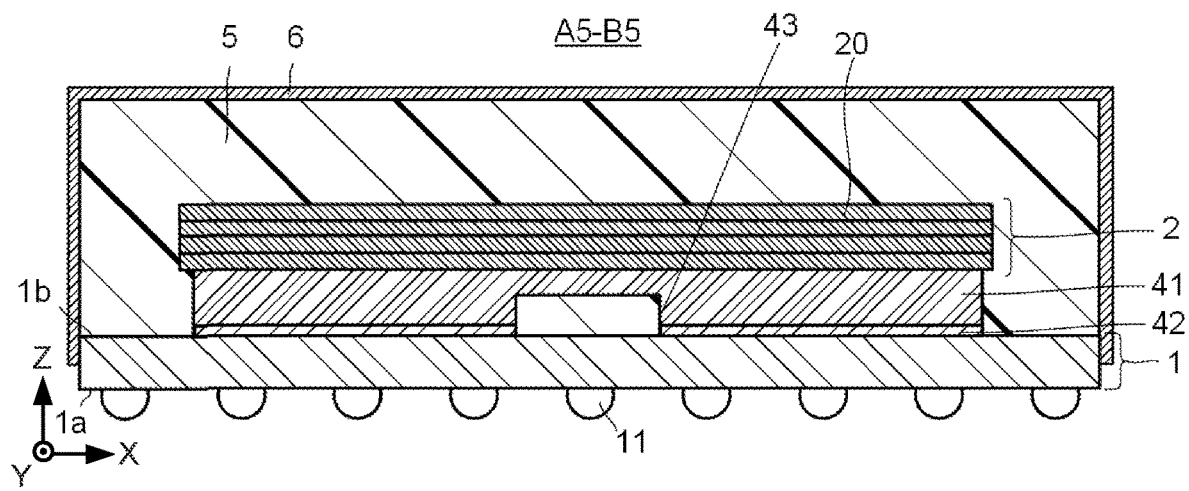
FIG. 9 is an explanatory schematic sectional view of the second structure example of the semiconductor device.
Figure 10:
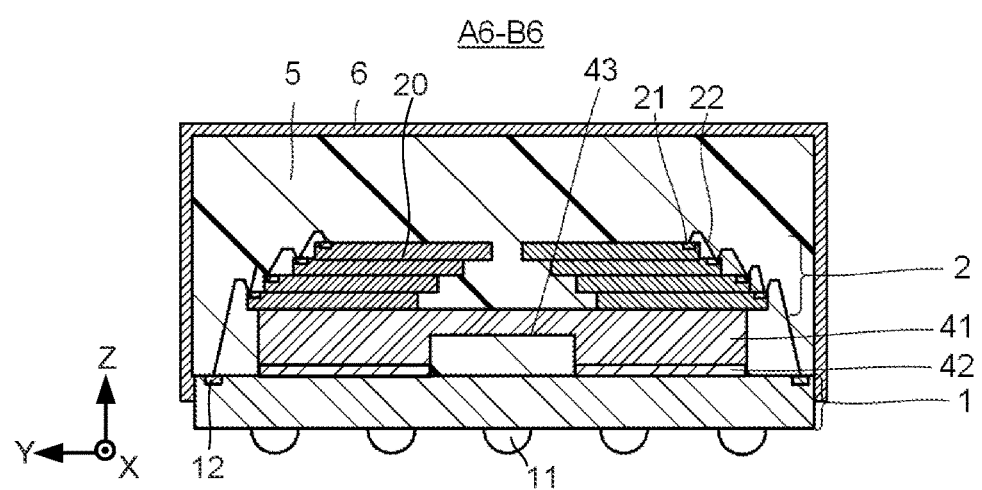
FIG. 10 is an explanatory schematic sectional view of the second structure example of the semiconductor device.
Figure 11:
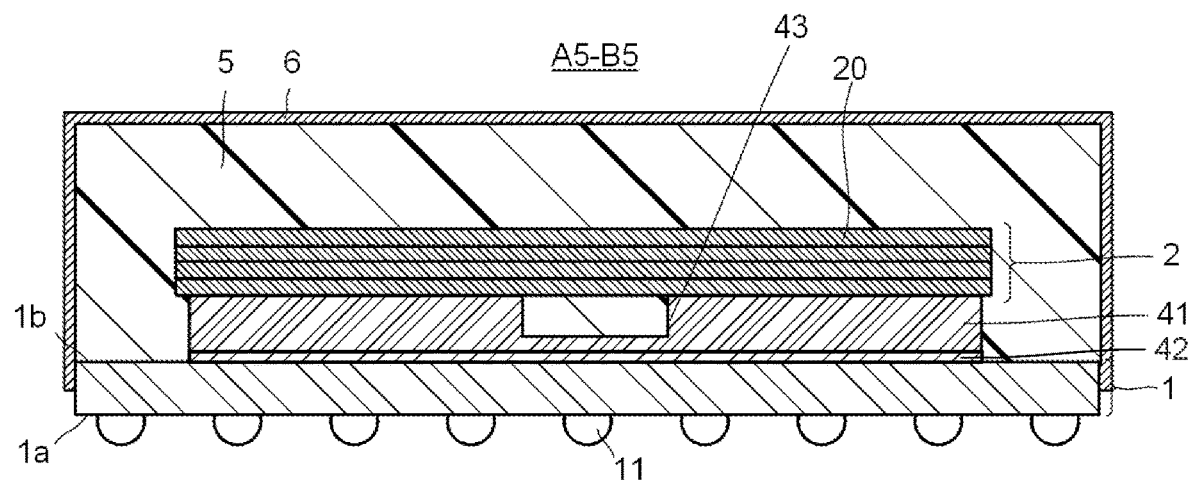
FIG. 11 is an explanatory schematic sectional view of the second structure example of the semiconductor device.
Figure 12:
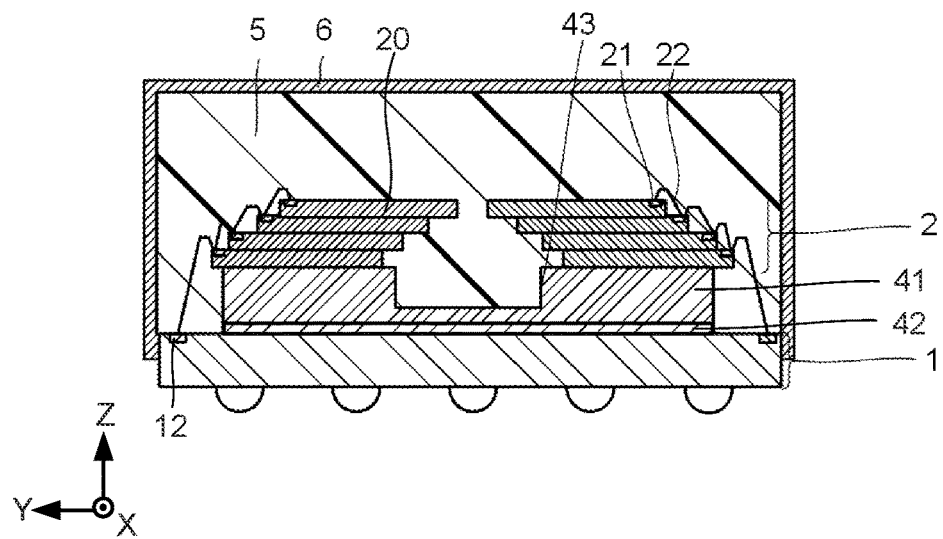
FIG. 12 is an explanatory schematic sectional view of the second structure example of the semiconductor device.

FIG. 8 is a schematic plan view illustrating a second structure example of the semiconductor device. FIG. 9 to FIG. 12 are explanatory schematic sectional views of the second structure example of the semiconductor device. FIG. 8 to FIG. 12 illustrate an X-axis, a Y-axis perpendicular to the X-axis, and a Z-axis perpendicular to the X-axis and the Y-axis. FIG. 8 illustrates an example of an X-Y plane. In FIG. 8, some constituent elements are not illustrated or illustrated using the dotted lines for convenience. FIG. 9 illustrates an example of an X-Z section along line A5-B5 in FIG. 8. FIG. 10 illustrates an example of a Y-Z section along line A6-B6 in FIG. 8. FIG. 11 illustrates another example of the X-Z section along line A5-B5 in FIG. 8. FIG. 12 illustrates another example of the Y-Z section along line A6-B6 in FIG. 8.

A semiconductor device 100 includes a wiring board 1, a chip stack 2, a semiconductor chip 3, a spacer 41, a sealing insulation layer 5, and a conductive shield layer 6. Since the wiring board 1, the chip stack 2, and the conductive shield layer 6 are the same as those in the first structure example of the semiconductor device, their description will be omitted here and their description in the first structure example can be referred to when necessary.

The spacer 41 has depressions 43. Each of the depressions 43 forms a passage connecting a region outside the spacer 41 and a region inside the spacer 41 on the surface 1b. FIG. 8 illustrates two of the depressions 43 extending in the X-axis direction and another two of the depressions 43 extending in the Y-axis direction, but the number of the depressions 43 is not limited to the number in FIG. 8. Further, the depressions 43 illustrated in FIG. 9 and FIG. 10 face on the wiring board 1 but this is not restrictive, and the depressions 43 may face on the semiconductor chip 20 of the bottom chip as illustrated in FIG. 11 and FIG. 12. Further, the shape of the depressions 43 is not limited as long as they are capable of connecting the region outside the spacer 41 and the region inside the spacer 41. When a member processed into a desired shape in advance for forming the spacer 41 is prepared, the depressions 43 are formed in the member, for instance. The other description of the spacer 41 is the same as the description of the spacer 41 in the first structure example.

The sealing insulation layer 5 extends through each passage defined by the corresponding depression 43, and the sealing insulation layer 5 covers the semiconductor chip 3. The other description of the sealing insulation layer 5 is the same as that of the sealing insulation layer 5 in the first structure example.

The formation of the depressions 43 on the spacer 41 enables a sealing resin to easily flow to a region between the wiring board 1 and the chip stack 2 through the depressions 43 in a sealing step of forming the sealing insulation layer 5, enabling the sufficient sealing of the semiconductor chip 3 to prevent the formation of voids. Therefore, the semiconductor device can have high reliability.

The second structure example of the semiconductor device can be appropriately combined with the other structure examples of the semiconductor device.

Third Structure Example of Semiconductor Device

Figure 13:
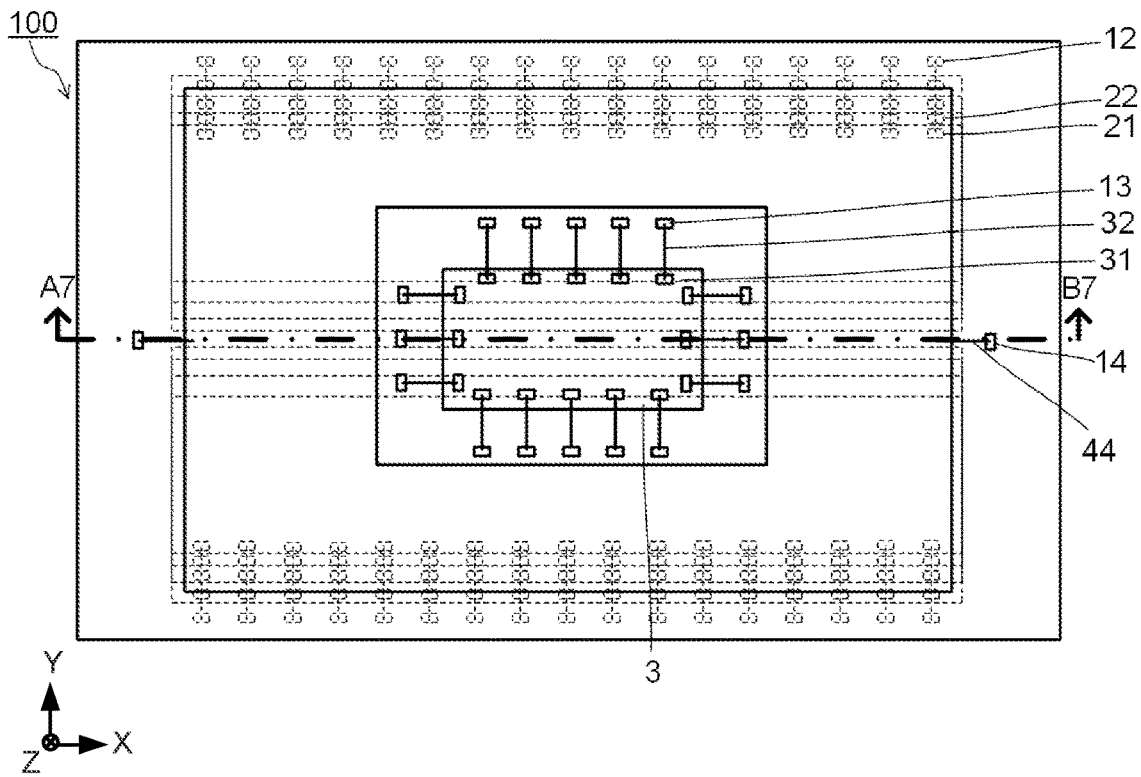
FIG. 13 is a schematic plan view illustrating a third structure example of the semiconductor device.
Figure 14:
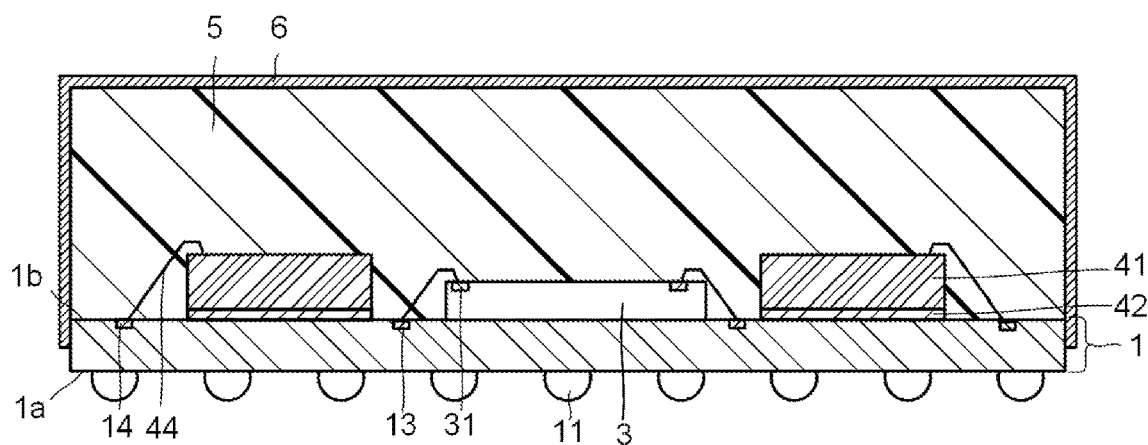
FIG. 14 is an explanatory schematic sectional view of the third structure example of the semiconductor device.
Figure 15:
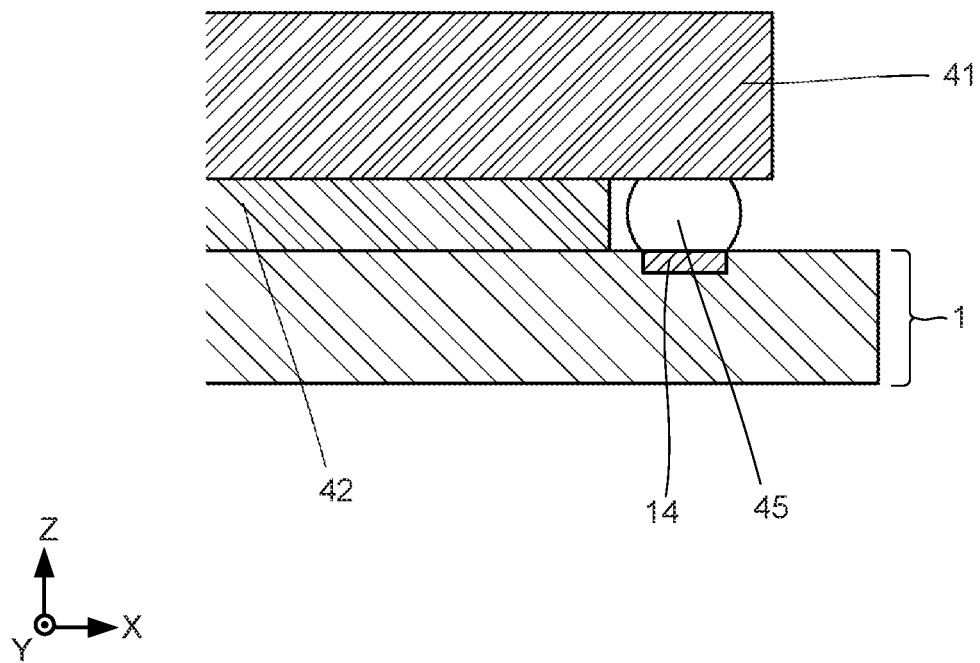
FIG. 15 is an explanatory schematic sectional view of the third structure example of the semiconductor device.

FIG. 13 is a schematic plan view illustrating a third structure example of the semiconductor device. FIG. 14 and FIG. 15 are explanatory schematic sectional views of the third structure example of the semiconductor device. FIG. 13 to FIG. 15 illustrate an X-axis, a Y-axis perpendicular to the X-axis, and a Z-axis perpendicular to the X-axis and the Y-axis. FIG. 13 illustrates an example of an X-Y plane. In FIG. 13, some constituent elements are not illustrated or illustrated using the dotted lines for convenience. FIG. 14 illustrates an example of an X-Z section along line A7-B7 in FIG. 13. FIG. 15 illustrates part of another example of the X-Z section along line A7-B7 in FIG. 13.

A semiconductor device 100 includes a wiring board 1, a chip stack 2, a semiconductor chip 3, a spacer 41, a sealing insulation layer 5, and a conductive shield layer 6. Since the chip stack 2, the semiconductor chip 3, and the conductive shield layer 6 are the same as those in the first structure example of the semiconductor device, their description will be omitted here, and their description in the first structure example can be referred to when necessary.

The wiring board 1 further includes bonding pads 14 on its surface 1b. The bonding pads 14 are connected to the external connection terminals 11 via the internal wiring of the wiring board 1. The bonding pads 14 each contain the material usable for the bonding pads 12 and the bonding pads 13, for instance. The other description of the wiring board 1 is the same as that of the wiring board 1 in the first structure example.

The spacer 41 has a conductive surface and is electrically connected to the wiring board 1. The spacer 41 illustrated in FIG. 13 and FIG. 14 is electrically connected to the bonding pads 14 of the wiring board 1 via bonding wires 44 but this is not restrictive, and the spacer 41 may be electrically connected to the bonding pads 14 of the wiring board 1 via bumps 45 as illustrated in FIG. 15. The bonding pads 14 are connected to the ground terminals which are the external connection terminals 11, for instance. The bumps 45 are formed on a surface of the spacer 41. In the case where the surface of the spacer 41 is plated, the bumps 45 are formed on a surface of a conductive film formed by the plating. Examples of the material of the bumps 45 include the materials usable for the external connection terminals 11. The other description of the spacer 41 is the same as that of the spacer 41 in the first structure example.

The sealing insulation layer 5 covers the bonding wires 44 or the bumps 45 and also covers the semiconductor chip 3. The other description of the sealing insulation layer 5 is the same as that of the sealing insulation layer 5 in the first structure example.

Electrically connecting the spacer 41 and the wiring board 1 enables the spacer 41 to be connected to the external connection terminal such as the ground terminal, for instance. This forms an electromagnetic shield using the spacer 41 to prevent the leakage of an unnecessary electromagnetic wave emitted from the semiconductor chips 20 and from the wiring layers of the wiring board 1, the semiconductor chips 20 and the wiring layers are covered with the sealing insulation layer 5. Therefore, the semiconductor device can have high reliability. The spacer 41 is not limited to the above and may be floating.

The third structure example of the semiconductor device can be appropriately combined with the other structure examples of the semiconductor device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a wiring board having a surface;
a chip stack disposed above the surface and having a first semiconductor chip;
a second semiconductor chip disposed between the surface and the chip stack;

a spacer disposed between the surface and the first semiconductor chip, the spacer surrounding the second semiconductor chip along the surface, and the spacer containing a material higher in thermal conductivity than silicon; and a sealing insulation layer covering the chip stack, wherein the spacer has a passage connecting a first region outside the spacer on the surface and a second region inside the spacer on the surface, the sealing insulation layer extends through the passage and covers the second semiconductor chip, and the passage is defined by a second depression facing on the chip stack.

2. The semiconductor device according to claim 1, wherein the spacer contains metal.

3. The semiconductor device according to claim 1, wherein the spacer contains ceramic.

4. The semiconductor device according to claim 1, wherein the spacer has a conductive surface.

5. The semiconductor device according to claim 4, wherein the spacer is electrically connected to the wiring board.

6. The semiconductor device according to claim 5, further comprising a bonding wire electrically connecting the spacer and the wiring board.

7. The semiconductor device according to claim 5, further comprising a bump electrically connecting the spacer and the wiring board.

8. The semiconductor device according to claim 1, wherein the spacer is joined to the surface via an adhesive layer, and the spacer is thinner than the adhesive layer.

9. The semiconductor device according to claim 1, wherein the first semiconductor chip is a memory chip, and the second semiconductor chip is a memory controller chip.

10. The semiconductor device according to claim 1, wherein the spacer has a plurality of the passages, one of the plurality of the passages extending along a first direction on the surface, and another of the plurality of the passages extending along a second direction intersecting the first direction on the surface.

11. The semiconductor device according to claim 1, wherein the spacer is in an electrically floating state.

12. A semiconductor device comprising:

a wiring board having a surface and a conductive pad disposed on the surface;

a chip stack disposed above the surface and having a first semiconductor chip;

a second semiconductor chip disposed between the surface and the chip stack;

a spacer disposed between the surface and the first semiconductor chip, the spacer surrounding the second semiconductor chip along the surface, the spacer containing a material higher in thermal conductivity than silicon, the spacer having a conductive surface;

a bump disposed between the spacer and the wiring board and connecting the conductive surface and the conductive pad; and a sealing insulation layer covering the chip stack, wherein the sealing insulation layer surrounds the bump.

13. The semiconductor device according to claim 12, wherein the wiring board has a ground terminal connected to the bonding conductive pad.

14. A semiconductor device comprising:

a wiring board having a surface;

a chip stack disposed above the surface and having a first semiconductor chip;

a second semiconductor chip disposed between the surface and the chip stack;

a spacer disposed between the surface and the first semiconductor chip, the spacer surrounding the second semiconductor chip along the surface, and the spacer containing a material higher in thermal conductivity than silicon; and a sealing insulation layer covering the chip stack, wherein the spacer has a plurality of passages connecting a first region outside the spacer on the surface and a second region inside the spacer on the surface, the sealing insulation layer extends through the passages and covers the second semiconductor chip, and one of the plurality of the passages extends along a first direction on the surface, and another of the plurality of the passages extends along a second direction intersecting the first direction on the surface.

15. The semiconductor device according to claim 14, wherein the spacer has a conductive surface.

16. The semiconductor device according to claim 15, wherein the spacer is electrically connected to the wiring board.

17. The semiconductor device according to claim 16, further comprising a bump electrically connecting the spacer and the wiring board.

18. The semiconductor device according to claim 14, wherein the spacer is joined to the surface via an adhesive layer, and the spacer is thinner than the adhesive layer.

19. The semiconductor device according to claim 14, wherein the first semiconductor chip is a memory chip, and the second semiconductor chip is a memory controller chip.

20. The semiconductor device according to claim 14, wherein the passages are defined by a first depression facing on the surface.

* * * * *